(12) United States Patent
Kawazoe et al.

(10) Patent No.: US 8,747,551 B2
(45) Date of Patent: Jun. 10, 2014

(54) PROCESS FOR PRODUCTION OF SILICON SINGLE CRYSTAL, AND HIGHLY DOPED N-TYPE SEMICONDUCTOR SUBSTRATE

(71) Applicant: Sumco Techxiv Corporation, Omura (JP)

(72) Inventors: Shinichi Kawazoe, Omura (JP); Yasuhito Narushima, Omura (JP); Toshimichi Kubota, Omura (JP); Fukuo Ogawa, Omura (JP)

(73) Assignee: Sumco Techxiv Corporation, Omura-shi, Nagasaki (JP)

( * ) Notice: Subject to any disclaimer, the term of this patent is extended or adjusted under 35 U.S.C. 154(b) by 0 days.

(21) Appl. No.: 14/038,136

(22) Filed: Sep. 26, 2013

(65) Prior Publication Data
US 2014/0020617 A1    Jan. 23, 2014

Related U.S. Application Data

(62) Division of application No. 12/602,479, filed as application No. PCT/JP2008/059512 on May 23, 2008, now Pat. No. 8,574,363.

(30) Foreign Application Priority Data

May 31, 2007    (JP) ................. 2007-146082

(51) Int. Cl.
    *C30B 15/04*       (2006.01)
(52) U.S. Cl.
    USPC ............. 117/21; 117/13; 117/19; 438/510; 438/514; 438/546; 438/547; 252/521.3
(58) Field of Classification Search
    CPC ...... C30B 29/06; C30B 15/04; C30B 11/002; C30B 15/00; C30B 15/20; H01L 21/02381; H01L 21/02532; H01L 21/02625
    USPC .......... 117/13, 19, 21; 438/510, 514, 546, 547
    See application file for complete search history.

(56) References Cited

U.S. PATENT DOCUMENTS

| | | | |
|---|---|---|---|
| 5,553,566 A | 9/1996 | Chiou et al. | |
| 5,744,396 A | 4/1998 | Chiou et al. | |
| 6,660,082 B2 | 12/2003 | Weber et al. | |
| 6,902,618 B2 | 6/2005 | Iida | |
| 7,132,091 B2 | 11/2006 | Kulkarni et al. | |
| 7,202,146 B2 | 4/2007 | Krautbauer et al. | |
| 2004/0069214 A1 | 4/2004 | Choi et al. | |
| 2006/0035448 A1 | 2/2006 | Krautbauer et al. | |
| 2010/0031871 A1 | 2/2010 | Narushima et al. | |

FOREIGN PATENT DOCUMENTS

| | | |
|---|---|---|
| JP | 59-156993 A | 9/1984 |
| JP | 01-246197 A | 10/1989 |
| JP | 09-007961 A | 1/1997 |
| JP | 2000-319087 A | 11/2000 |
| JP | 2002-145694 A | 5/2002 |
| JP | 2004-137140 A | 5/2004 |
| JP | 2004-175658 A | 6/2004 |
| JP | 2004-307305 A | 11/2004 |
| JP | 2005-223092 A | 8/2005 |
| JP | 2006-052133 A | 2/2006 |

OTHER PUBLICATIONS

Related U.S. Appl. No. 12/524,331; First named inventor: Yasuhito Narushima; Title: "Doping apparatus and method for Manufacturing Silicon Single Crystal"; filed Jul. 23, 2009.
Non-final Office Action dated Jan. 20, 2011, in related U.S. Appl. No. 12/524,331.
International Preliminary Report on Patentability, Chapter I of the Patent Cooperation Treaty for PCT/JP2008/059512 and Written Opinion of the International Searching Authority, issued Jan. 12, 2010.
Y. Shirashi, et al., "Prediction of solid-liquid interface shape during CZ Si crystal growth using experimental and global simulation," Elsevier Journal of Crystal Growth 266 (2004) pp. 28-33.
V.M. Glazov et al., "Physicochemical Principles of Semiconductor Doping," Moskva 1967, pp. 140-147.
Japanese Office Action dated Apr. 14, 2009 and English translation thereof issued in a counterpart Japanese Application No. 2007-146082.
Japanese Office Action dated Jul. 28, 2009 and English translation thereof issued in a counterpart Japanese Application No. 2007-146082.

(Continued)

*Primary Examiner* — Mark Kopec
*Assistant Examiner* — Haidung Nguyen
(74) *Attorney, Agent, or Firm* — Holtz Holtz Goodman & Chick PC

(57) ABSTRACT

After adding phosphorus (P) and germanium (Ge) into a silicon melt or adding phosphorus into a silicon/germanium melt, a silicon monocrystal is grown from the silicon melt by a Czochralski method, where a phosphorus concentration $[P]_L$(atoms/cm$^3$) in the silicon melt, a Ge concentration in the silicon monocrystal, an average temperature gradient $G_{ave}$ (K/mm) and a pull speed V (mm/min) are controlled to satisfy a formula (1) as follows, a phosphorus concentration [P] (atoms/cm$^3$) and the Ge concentration [Ge](atoms/cm3) in the silicon monocrystal satisfy a relationship according to a formula (2) as follows while growing the silicon monocrystal, where $d_{Si}$(Å) represents a lattice constant of silicon, $r_{Si}$(Å) represents a covalent radius of silicon, $r_P$(Å) represents a covalent radius of phosphorus, and $r_{Ge}$(Å) represents a covalent radius of Ge:

$$[P]_L + (0.3151 \times [Ge] + 3.806 \times 10^{18})/1.5 < 0.5 \times (G_{ave}/V + 43) \times 10^{19} \quad (1)$$

$$\left(\left(\frac{r_{Ge} - r_{Si}}{r_{Si}}\right) \times \frac{[Ge]}{[Si]} + \left(\frac{r_P - r_{Si}}{r_{Si}}\right) \times \frac{[P]}{[Si]}\right) \times d_{Si} < \quad (2)$$
$$-4.24736 \times 10^{-23} \times [P] + 2.78516 \times 10^{-3}.$$

2 Claims, 8 Drawing Sheets

(56) References Cited

OTHER PUBLICATIONS

Japanese Office Action dated Oct. 27, 2009 and English translation thereof issued in a counterpart Japanese Application No. 2007-146082.

Surface Science Technology Series 3, "Science of Silicon" USC Semiconductor Basic Technology Research Group Supervised by Tadahiro Oomi and Takahisa Nitta, ISBN: 4-947655-88-7, C3055 P61800E 1996, pp. 999-1000 (English Abstract attached).

English Language International Search Report dated Jul. 1, 2008 issued in parent Appln. No. PCT/JP2008/059512.

PROCESS FOR PRODUCTION OF SILICON SINGLE CRYSTAL, AND HIGHLY DOPED N-TYPE SEMICONDUCTOR SUBSTRATE

This is a Divisional of U.S. application Ser. No. 12/602,479, filed Nov. 30, 2009, which is a U.S. National Phase Application under 35 USC 371 of International Application PCT/JP2008/059512, filed May 23, 2008.

TECHNICAL FIELD

The present invention relates to a producing method of a silicon monocrystal and an N-type highly doped semiconductor substrate.

BACKGROUND ART

Epitaxial layers are often provided on silicon wafer substrates highly doped with P-type or N-type dopants in order to improve performance of semiconductor devices.

When dopant atoms are highly doped on silicon substrates, difference in the size (covalent radius) of the dopant atoms and silicon substrate atoms results in a strain in crystal to generate an internal stress. The magnitude of the generated stress increases in accordance with the thickness of the epitaxial layers.

When a lowly doped epitaxial layer is provided on such a highly doped semiconductor substrate, misfit dislocation occurs at an interface between the substrate and the epitaxial layer, which is transmitted to the topmost surface of the epitaxial layer. The generated dislocation causes junction leakage and the like to impair the performance of the semiconductor devices.

It has therefore been proposed that, when boron (B) is used as P-type dopant and to be highly doped, germanium (Ge) is doped together with boron (see, for instance, Patent Documents 1 and 2).

According to Patent Document 1, the added germanium restrains decrease in lattice constant of silicon caused on account of the large amount of added boron, so that generation of the misfit dislocation can be effectively restrained.

In the above Patent Document 2, since boron and germanium are added as dopants, the lattice constant that is changed under the influence of the highly doped boron at a site near an interface with a thermally-oxidized film of silicon wafer is compensated by germanium. Consequently, no strain occurs on a wafer facial layer after the thermally oxidized film is removed and the wafer is not deformed while growing the epitaxial layer, so that no misfit dislocation occurs in the epitaxial layer.

On the other hand, Patent Document 3 discloses an exemplary use of phosphorus (P) as an N-type dopant. According to the technique disclosed in Patent Document 3, germanium is added when a large amount of phosphorus is doped in silicon to compensate for the strain in crystal lattice caused by phosphorus to prevent the misfit dislocation from being generated.

[Patent Document 1] JP-A-2004-175658
[Patent Document 2] JP-A-2005-223092
[Patent Document 3] JP-A-09-7961

DISCLOSURE OF THE INVENTION

Problems to be Solved by the Invention

However, the technique disclosed in patent document 3 accompanies the following problems.

Specifically, addition of a large amount of phosphorus and germanium as dopants as in the above, especially when an N-type low-resistivity crystal is to be grown, results in excessively large freezing point depression to cause a compositional supercooling phenomenon.

When a large compositional supercooling occurs, a growth different from that at silicon growth face starts at a crystal growth interface, which causes an abnormal growth (Cell growth). When such an abnormal growth occurs during an ingot-growing phase, monocrystallization is hindered.

An object of the invention is to provide a producing method of silicon monocrystal that is adapted to produce an N-type highly doped monocrystal without causing abnormal growth within a crystal when a silicon monocrystal is to be grown by Czochralski (CZ) method, and an N-type highly doped semiconductor substrate.

Means for Solving the Problems

A producing method of a silicon monocrystal according to an aspect of the invention includes: adding phosphorus (P) and germanium (Ge) into a silicon melt or adding phosphorus into a silicon/germanium melt; and growing a silicon monocrystal from the silicon melt by a Czochralski method, in which a phosphorus concentration $[P]_L$(atoms/cm$^3$) in the silicon melt, a Ge concentration in the silicon monocrystal, an average temperature gradient $G_{ave}$ (K/mm) and a pull speed V (mm/min) are controlled to satisfy a formula (1) as follows, the phosphorus concentration [P](atoms/cm$^3$) in the silicon monocrystal is $4.84 \times 10^{19}$ atoms/cm$^3$ or more and $8.49 \times 10^{19}$ atoms/cm$^3$ or less, and the phosphorus concentration [P](atoms/cm$^3$) and the Ge concentration [Ge](atoms/cm$^3$) in the silicon monocrystal satisfy a relationship according to a formula (2) as follows while growing the silicon monocrystal.

$$[P]_L + (0.3151 \times [Ge] + 3.806 \times 10^{18})/1.5 < 0.5 \times (G_{ave}/V + 43) \times 10^{19} \quad (1)$$

$$[Ge] < -6.95 \times [P] + 5.90 \times 10^{20} \quad (2)$$

In the above, the concentration of germanium in the growing crystal is difficult to be controlled because the concentration accords with theoretical equilibrium segregation in accordance with a doping amount. Therefore, the phosphorus concentration is controlled by a pull-up condition, mainly by pressure, flow volume of inert gas (Ar) in the chamber and pull-up speed as well as the doping amount to be adjusted to a desired level of concentration.

According to the above aspect of the invention, since the relationship between the phosphorus concentration and the germanium concentration in the growing crystal satisfies the relationship shown in the formula (2), a monocrystal can be grown without causing an abnormal growth in the crystal, thus stably obtaining an N-type highly doped semiconductor substrate.

Further, when phosphorus and germanium are simultaneously doped, final monocrystallization rate after pulling up the crystal can be improved and deformation of crystal during the pulling-up process at the initial stage of doping can be prevented.

A producing method of a silicon monocrystal according to another aspect of the invention includes: adding phosphorus (P) and germanium (Ge) into a silicon melt or adding phosphorus into a silicon/germanium melt; and growing a silicon monocrystal from the silicon melt by a Czochralski method a phosphorus concentration, where a phosphorus concentration $[P]_L$(atoms/cm$^3$) in the silicon melt, a Ge concentration in the silicon monocrystal, an average temperature gradient $G_{ave}$ (K/mm) and a pull speed V (mm/min) are controlled to satisfy a formula (3) as follows, the phosphorus concentration [P] (atoms/cm³) and the Ge concentration [Ge](atoms/cm³) in the silicon monocrystal satisfy a relationship according to a formula (4) as follows while growing the crystal, where $d_{Si}$ (Å) represents a lattice constant of silicon, $r_{Si}$(Å) represents a covalent radius of silicon, $r_P$(Å) represents a covalent radius of phosphorus and $r_{Ge}$(Å) represents a covalent radius of Ge.

$$[P]_L + (0.3151 \times [Ge] + 3.806 \times 10^{18})/1.5 < 0.5 \times (G_{ave}/V + 43) \times 10^{19} \quad (3)$$

$$\left(\left(\frac{r_{Ge} - r_{Si}}{r_{Si}}\right) \times \frac{[Ge]}{[Si]} + \left(\frac{r_p - r_{Si}}{r_{Si}}\right) \times \frac{[P]}{[Si]}\right) \times d_{Si} < \quad (4)$$
$$-4.24736 \times 10^{-23} \times [P] + 2.78516 \times 10^{-3}$$

By thus growing the crystal while satisfying the relationship between the phosphorus concentration and Ge concentration, an abnormal growth can also be prevented while growing the crystal.

In the above aspect of the invention, the phosphorus concentration [P](atoms/cm³) and the Ge concentration [Ge](atoms/cm³) in the silicon monocrystal preferably satisfy a relationship according to a formula (5) as follows while growing the crystal.

$$2.2 \times [P] - 8.62 \times 10^{19} < [Ge] < 2.2 \times [P] + 8.62 \times 10^{19} \quad (5)$$

According to the above arrangement, since a predetermined amount of germanium is doped, lattice distortion caused by phosphorus can be reliably compensated by germanium, so that generation of misfit dislocation can be avoided when epitaxial layer is formed on a surface of a semiconductor substrate obtained from a produced ingot. Incidentally, there is no lower limit in the germanium concentration in terms of abnormal growth occurrence.

An N-type highly doped semiconductor substrate according to still another aspect of the invention is obtained by: adding phosphorus (P) and germanium (Ge) into a silicon melt or adding phosphorus into a silicon/germanium melt; and growing a silicon monocrystal from the silicon melt by a Czochralski method, in which a phosphorus concentration $[P]_L$(atoms/cm³) in the silicon melt, a Ge concentration in the silicon monocrystal, an average temperature gradient $G_{ave}$ (K/mm) and a pull speed V (mm/min) are controlled to satisfy a formula (6) as follows, the phosphorus concentration [P] (atoms/cm³) in the silicon monocrystal is $4.84 \times 10^{19}$ atoms/cm³ or more and $8.49 \times 10^{19}$ atoms/cm³ or less, and the phosphorus concentration [P](atoms/cm³) and the Ge concentration [Ge](atoms/cm³) in the silicon monocrystal satisfy a relationship according to a formula (7) as follows while growing the silicon monocrystal.

$$[P]_L + (0.3151 \times [Ge] + 3.806 \times 10^{18})/1.5 < 0.5 \times (G_{ave}/V + 43) \times 10^{19} \quad (6)$$

$$[Ge] < -6.95 \times [P] + 5.90 \times 10^{20} \quad (7)$$

An N-type highly doped semiconductor substrate according to a further aspect of the invention is obtained by: adding phosphorus (P) and germanium (Ge) into a silicon melt or adding phosphorus into a silicon/germanium melt; and growing a silicon monocrystal from the silicon melt by a Czochralski method, in which a phosphorus concentration $[P]_L$(atoms/cm³) in the silicon melt, a Ge concentration in the silicon monocrystal, an average temperature gradient $G_{ave}$ (K/mm) and a pull speed V (mm/min) are controlled to satisfy a formula (8) as follows, the phosphorus concentration [P] (atoms/cm³) and the Ge concentration [Ge](atoms/cm³) in the silicon monocrystal satisfy a relationship according to a formula (9) as follows while growing the silicon monocrystal, where $d_{Si}$(Å) represents a lattice constant of silicon, $r_{Si}$(Å) represents a covalent radius of silicon, $r_P$(Å) represents a covalent radius of phosphorus and $r_{Ge}$(Å) represents a covalent radius of Ge.

$$[P]_L + (0.3151 \times [Ge] + 3.806 \times 10^{18})/1.5 < 0.5 \times (G_{ave}/V + 43) \times 10^{19} \quad (8)$$

$$\left(\left(\frac{r_{Ge} - r_{Si}}{r_{Si}}\right) \times \frac{[Ge]}{[Si]} + \left(\frac{r_p - r_{Si}}{r_{Si}}\right) \times \frac{[P]}{[Si]}\right) \times d_{Si} < \quad (9)$$
$$-4.24736 \times 10^{-23} \times [P] + 2.78516 \times 10^{-3}$$

In the above aspect of the invention, the phosphorus concentration [P](atoms/cm³) and the Ge concentration [Ge](atoms/cm³) in the silicon monocrystal preferably satisfy the relationship according to a formula (10).

$$2.2 \times [P] - 8.62 \times 10^{19} < [Ge] < 2.2 \times [P] + 8.62 \times 10^{19} \quad (19)$$

In the above, a resistivity of the N-type highly doped semiconductor substrate is preferably 3 mΩ·cm or less.

The resistivity may be at any level in a range of 3 mΩ·cm or less, however, preferably in a range of 2.5 mΩ·cm or less and more preferably in a range of 1.5 mΩ·cm or less. Incidentally, the resistivity of the N-type highly doped semiconductor substrate can be theoretically lowered by controlling an average temperature gradient Gave (k/mm) of the silicon crystal near a surface of the silicon melt and a pulling-up speed V (mm/min). However, considering practical productivity, a reference lower limit is 0.5 mΩ·cm.

According to the above arrangement, since a low-resistive substrate can be reliably produced by a stable producing method, the substrate can be favorably used as a substrate of a power MOSFET and the like.

BEST MODE FOR CARRYING OUT THE INVENTION

An exemplary embodiment of the invention will be described below with reference to the attached drawings.

1. On Abnormal Growth

Initially, abnormal growths occurred when a monocrystal is grown by CZ method from a silicon melt in which only phosphorus is doped and from a silicon melt in which phosphorus and germanium are co-doped are checked. Pull-up conditions at this time are shown in the following tables 1 and 2, where a pull-up speed as well as a doping amount of germanium is altered as a control parameter.

Incidentally, in order to co-dope phosphorus and germanium, the following arrangement is employed.

Initially, a doping device having an upper dopant chamber and a lower dopant chamber are provided, the upper and lower dopant chambers respectively accommodating different dopants, an upper part of the upper dopant chamber being opened and a lower part of the lower dopant chamber being opened. Phosphorus is accommodated in the upper dopant chamber and germanium is accommodated in the lower dopant chamber.

Next, the doping device is situated above a quartz crucible in which silicon melt is supplied. Subsequently, the doping device is placed near a position at which temperature is raised to a melting point of phosphorus and germanium. Then, phosphorus is evaporated to be a dopant gas, which is flowed out of the upper opening of the upper dopant chamber and is guided toward a proximity of a surface of the silicon melt to be dissipated into the silicon melt. On the other hand, germanium is liquefied to flow out of the lower opening of the lower dopant chamber to be dissipated into the silicon melt through a conduit.

Figure 1:
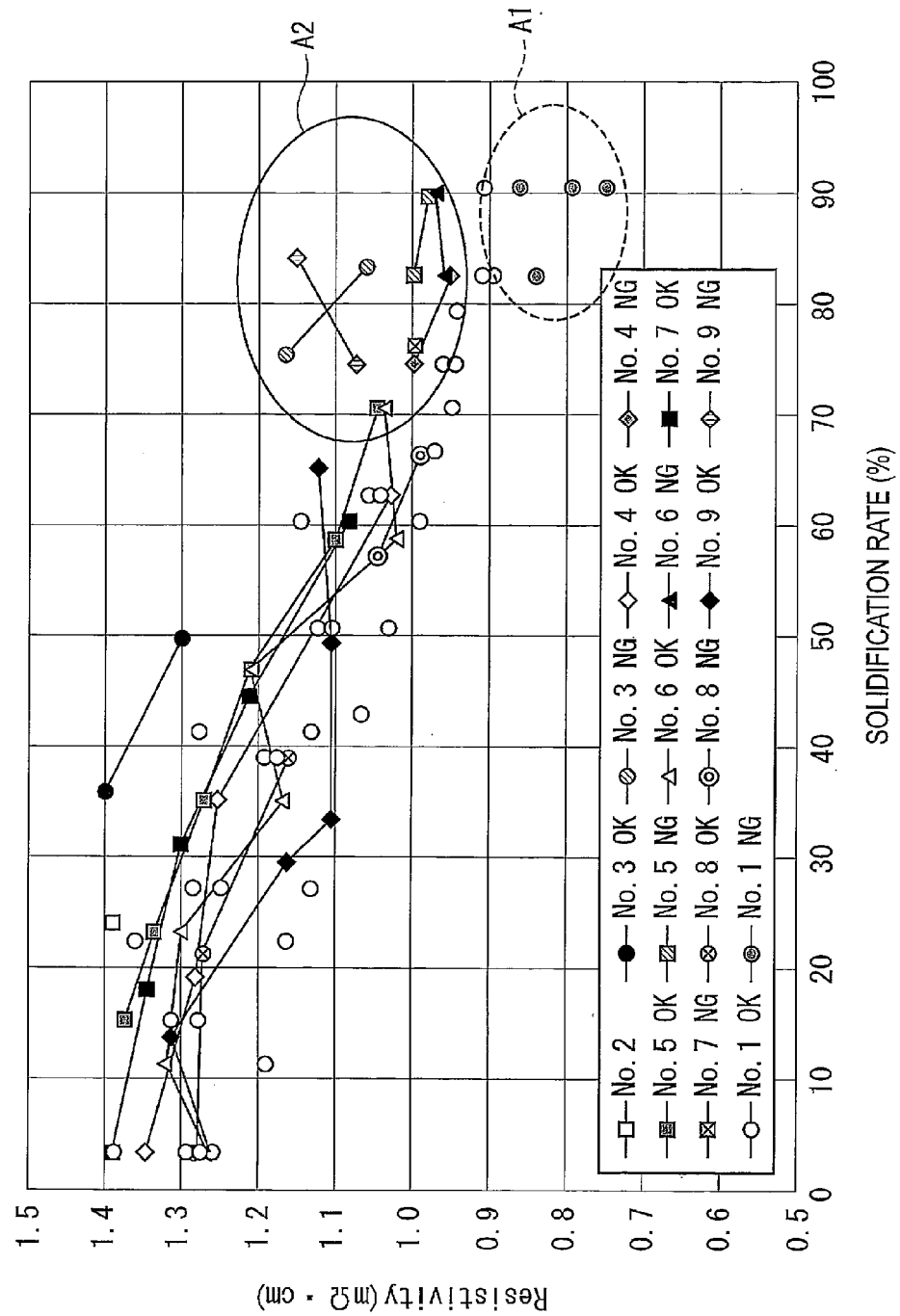
FIG. 1 is a scatter diagram showing a relationship between a solidification rate and resistivity of a growing crystal in an exemplary embodiment of the invention.

After studying the relationship between the solidification rate and resistivity of the grown monocrystal, results shown in FIG. 1 was obtained. Incidentally, the signs "OK" after the number of the respective pull-up conditions indicate that no abnormal growth occurred and the signs "NG" indicate that abnormal growths occurred.

In a sample No. 1 in which only phosphorus was doped, an abnormal growth occurred in an area A1. In contrast, in samples Nos. 2 to 9 in which phosphorus and germanium were co-doped, the abnormal growth occurred in an area A2, which showed that the abnormal growth occurred on a high-resistivity side as compared to the one in which only phosphorus was doped. It is assumed that this resulted from the doping of germanium.

Figure 2:
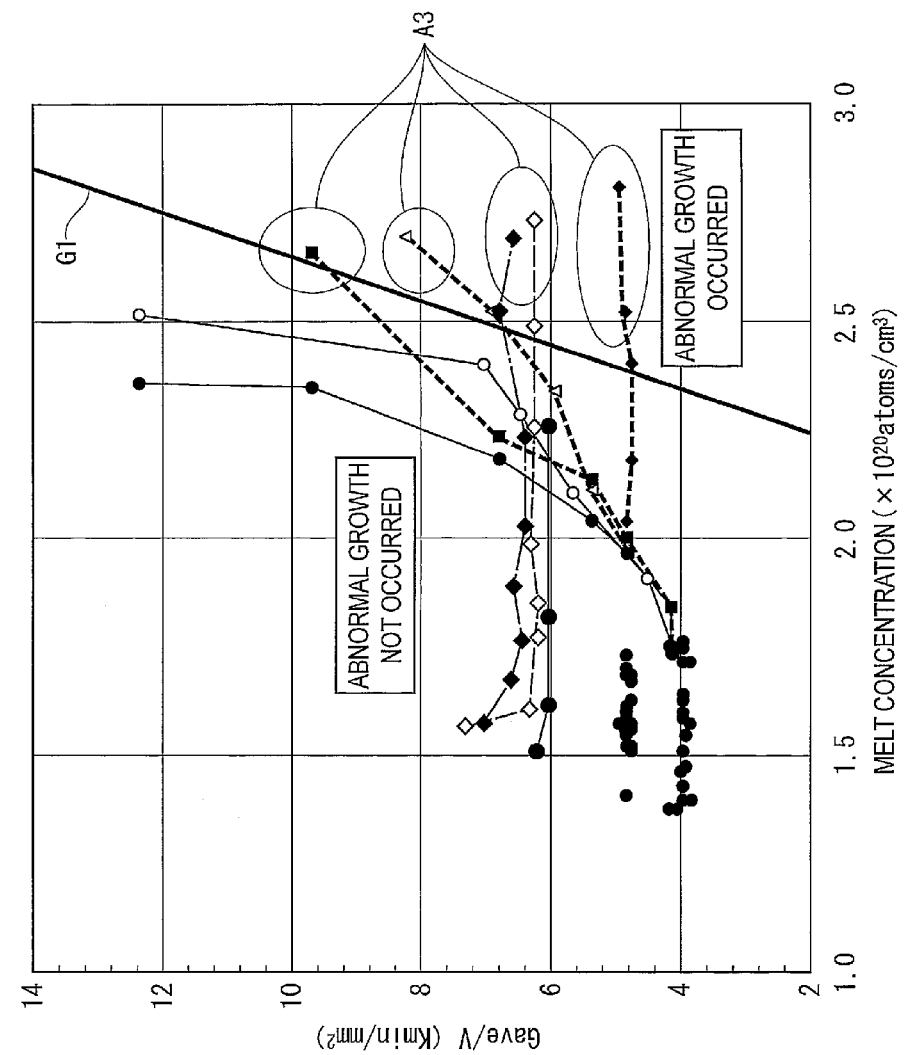
FIG. 2 is a graph showing a relationship between a phosphorus concentration in a silicon melt and Gave/V in the above exemplary embodiment.

Next, in the sample No. 1 in which only phosphorus was doped, phosphorus concentration in the silicon melt (melt concentration) was plotted along a horizontal axis and a ratio between an average temperature gradient Gave (K/mm) of the silicon crystal near the surface of the silicon melt and pull-up speed V (mm/min) was plotted along a vertical axis. The study of a relationship between the concentration and the ratio revealed that the abnormal growth occurred in an area A3 as shown in FIG. 2, where a critical line G1 that divided the area according to the presence of the occurrence of the abnormal growth could be drawn.

In the above, the average temperature gradient Gave (K/mm) is defined as a variant representing heat-radiation properties of a silicon crystal near the surface of the silicon melt in a CZ furnace, which is more specifically defined in the following article:

"Prediction of solid-liquid interface shape during CZ Si crystal growth using experimental and global simulation" (Journal of Crystal Growth, Volume 266, Issues 1-3, May 15, 2004, P. 28-33, by Yutaka Shiraishi, Susumu Maeda and Kozo Nakamura)

TABLE 1

| | | No. 1 | No. 2 | No. 3 | No. 4 | No. 5 |
|---|---|---|---|---|---|---|
| Charged Amount (kg) | | 100 | 100 | 100 | 100 | 100 |
| P-Doping Amount (g) | | 500 | 500 | 500 | 500 | 500 |
| Ge-Doping Amount (g) | | 0 | 750 | 750 | 500 | 500 |
| Target Resistivity Rate (mΩ · cm) | | 1.3 | 1.3 | 1.3 | 1.3 | 1.3 |
| Cylindrical Body Condition | Pull-Up Speed (mm/min) | 0.75->0.4 | 0.75->0.4 | 0.75->0.3 | 0.75->0.25 | 0.75->0.2 |
| | Pressure in Furnace (Pa) | 59985 | 59985 | 59985 | 59985 | 59985 |
| | Ar Flow Rate (L/min) | 200 | 200 | 200 | 200 | 200 |

TABLE 2

| | | No. 6 | No. 7 | No. 8 | No. 9 |
|---|---|---|---|---|---|
| Charged Amount (kg) | | 100 | 100 | 100 | 100 |
| P-Doping Amount (g) | | 500 | 500 | 500 | 500 |
| Ge-Doping Amount (g) | | 500 | 600 | 750 | 750 |
| Target Resistivity Rate (mΩ · cm) | | 1.3 | 1.3 | 1.3 | 1.3 |
| Cylindrical Body Condition | Pull-Up Speed (mm/min) | 0.75->0.2 | 0.75->0.2 | 0.75->0.2 | 0.75->0.4 |
| | Pressure in Furnace (Pa) | 59985 | 59985 | 59985 | 59985 |
| | Ar Flow Rate (L/min) | 200 | 200 | 200 | 200 |

After calculating a formula representing the critical line G1 in FIG. 2, it was revealed that the ratio Gave/V (K·min/mm²) between the average temperature gradient Gave (K/mm) and the pull-up speed V(mm/min) followed the following formula (11) according to the phosphorus concentration in the silicon melt [P] (atoms/cm³):

$$G_{ave}/V = 2.0 \times 10^{-19}[P] - 43 \qquad (11)$$

Since no abnormal growth occurred in the area on the left side of the critical line G1 in FIG. 2, it is recognized that the abnormal growth does not occur when the following formula (12) is satisfied.

$$G_{ave}/V > 2.0 \times 10^{-19}[P] - 43 \quad (12)$$

Next, a relationship between the critical line G1 and the occurrence of the abnormal growth in the samples Nos. 2 to 9 in which phosphorus and germanium were co-doped was studied. Then, it was confirmed that the abnormal growth also occurred in an area on the left side given by the above formula (11), i.e. on a lower-concentration side of the critical line G1 in which only phosphorus was doped. It is considered that the abnormal growth occurred because the freezing point depression degree of the silicon melt was increased on account of the co-doped germanium.

Accordingly, the freezing point depression degrees according to altering germanium concentration in the silicon melt were calculated in a silicon-germanium phase diagram to calculate a phosphorus concentration equivalent to the freezing point depression degree according to germanium concentration. In other words, it is supposed that, on the basis of phosphorus concentration, the critical line G1 given by the above formula (12) remained unchanged since the average temperature gradients of the silicon crystal near the silicon melt were the same.

The relationship between the freezing point depression degree by germanium and the phosphorus concentration in the crystal equivalent to the germanium is disclosed in:

"PHYSICOCHEMICAL PRINCIPLE OF SEMICONDUCTOR DOPING"

Figure 3:
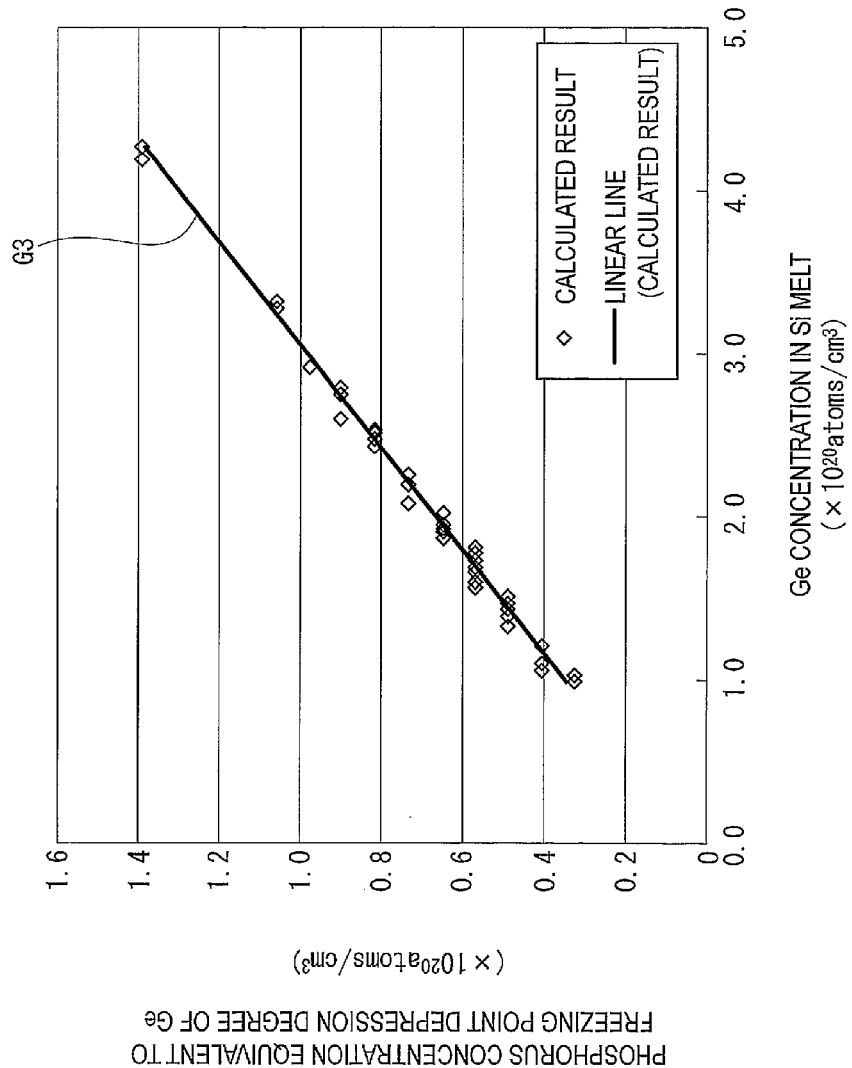
FIG. 3 is a graph for converting a germanium concentration in the growing crystal into a phosphorus concentration in the above exemplary embodiment.

(V. M. Glazov, V. S. Zemskov., P. 142-(1968)

which can be represented in a graph G3 shown in FIG. 3.

The formula giving the graph G3 can be represented by the following formula (13), where a conversion concentration in which germanium concentration in a growing crystal is converted into phosphorus concentration is [Ge→P]s (atoms/cm³) and germanium concentration in the growing crystal is [Ge]s (atoms/cm³).

$$[Ge \to P]_S = 0.3151 \times [Ge]_S + 3.806 \times 10^{18} \quad (13)$$

Since the abnormal growth is influenced by a dopant concentration in the silicon melt, the following formula (14) is established by converting the above formula (13) into the concentration in the silicon melt according to theoretical expression of equilibrium segregation $C_S = kC_L$ (k: coefficient of equilibrium segregation), where solid concentration is $C_S$ and concentration in the melt is $C_L$. Incidentally, the conversion concentration in which germanium concentration in the silicon melt is converted into phosphorus concentration is represented as $[Ge \to P]_L$ (atoms/cm³).

$$[Ge \to P]_L = (0.3151 \times [Ge]_S + 3.806 \times 10^{18})/k \quad (14)$$

Accordingly, when phosphorus and germanium are co-doped, the dopant concentration in the silicon melt [X] can be calculated according to the following formula (15). Incidentally, the conversion concentration in which germanium concentration in the silicon melt is converted into phosphorus concentration is represented as $[Ge \to P]_L$ (atoms/cm³) and the phosphorus concentration in the silicon melt is $[P]_L$ (atoms/cm³).

$$[X] = [P]_L + [Ge \to P]_L \quad (15)$$

However, when the dopant concentration [X] according to the above formula (15) was directly applied, it was found that the dopant concentration was shifted off the area represented by the formula (12). Accordingly, in order to adjust the dopant concentration to the area represented by the formula (12), $[Ge \to P]_L$ was subjected to a fitting, where the dopant concentration [X] in the silicon melt was set as in the following formula (16) with the use of a coefficient of 0.66 (1/1.5).

$$[X] = [P]_L + [Ge \to P]_L / 1.5 \quad (16)$$

Figure 4:
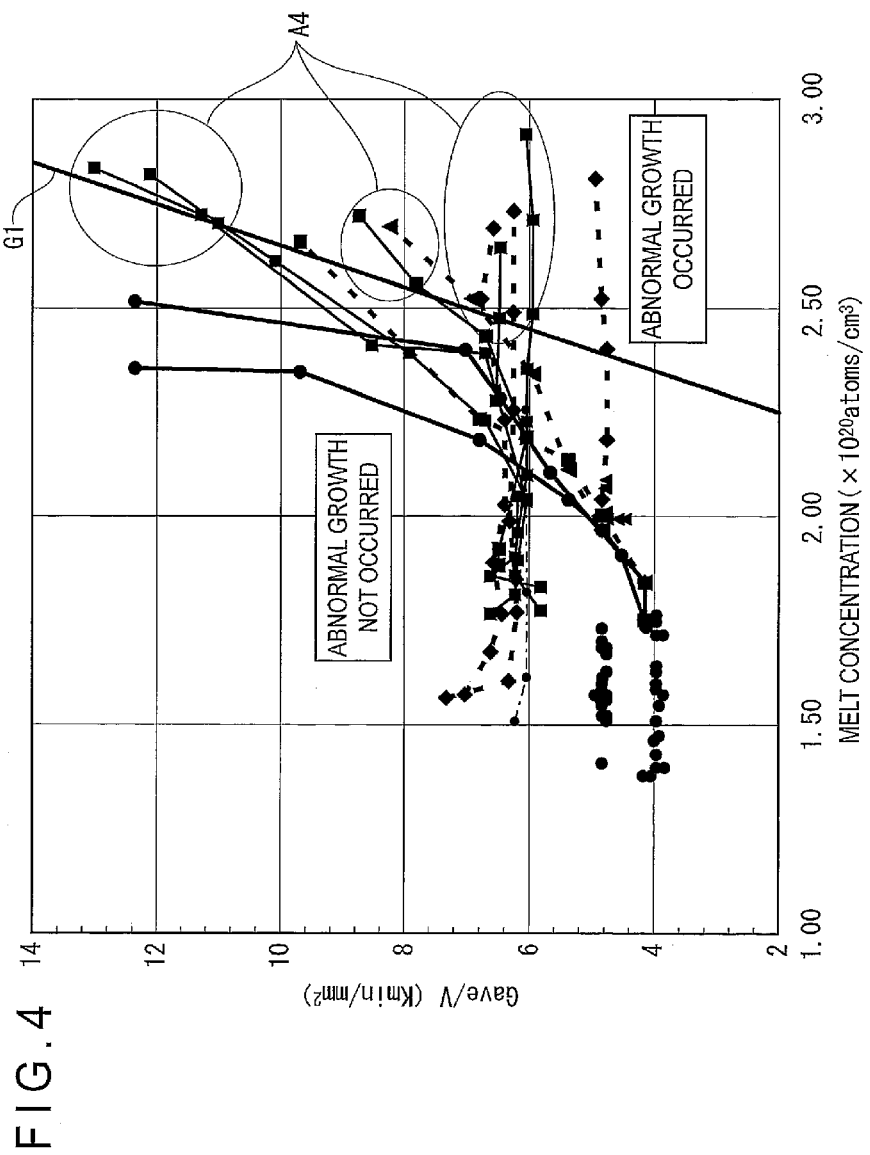
FIG. 4 is a graph showing a relationship between a conversion dopant concentration in which the germanium concentration is converted into the phosphorus concentration to be added and Gave/V in the above exemplary embodiment.

When the relationship between the critical line G1 and the abnormal growth occurrence areas in the samples Nos. 2 to 9 was checked based on the converted dopant concentration [X], it was found that, as shown in FIG. 4, the abnormal growth occurrence area A4 was shown on the right side of the critical line G1, i.e. on the high-concentration side and the abnormal growth occurrence area A4 was not shown on the left side of the critical line G1, i.e. on the low-concentration side.

In other words, it was confirmed that, when phosphorus and germanium were co-doped, the occurrence of the abnormal growth did not occur according to the above conversion in an area on the low-concentration side relative to the critical line G1 given by the above formula (11).

In view of the above, the condition for preventing the generation of an abnormal growth in a growing crystal is given by the following formula (17), where phosphorus concentration [P], germanium concentration [Ge] and Gave/V in the silicon melt are used as parameters.

$$[P]_L + (0.3151 \times [Ge] + 3.806 \times 10^{18})/1.5 < 0.5 \times (G_{ave}/V + 43) \times 10^{19} \quad (17)$$

The above test showed that, even when phosphorus and germanium were co-doped, occurrence of an abnormal growth could be clearly determined by a borderline of the critical line G1 that showed a border of occurrence of an abnormal growth when only phosphorus was doped. However, no physical explanation on how much germanium concentration relative to phosphorus concentration prevented the occurrence of the abnormal growth was given yet.

Figure 5:
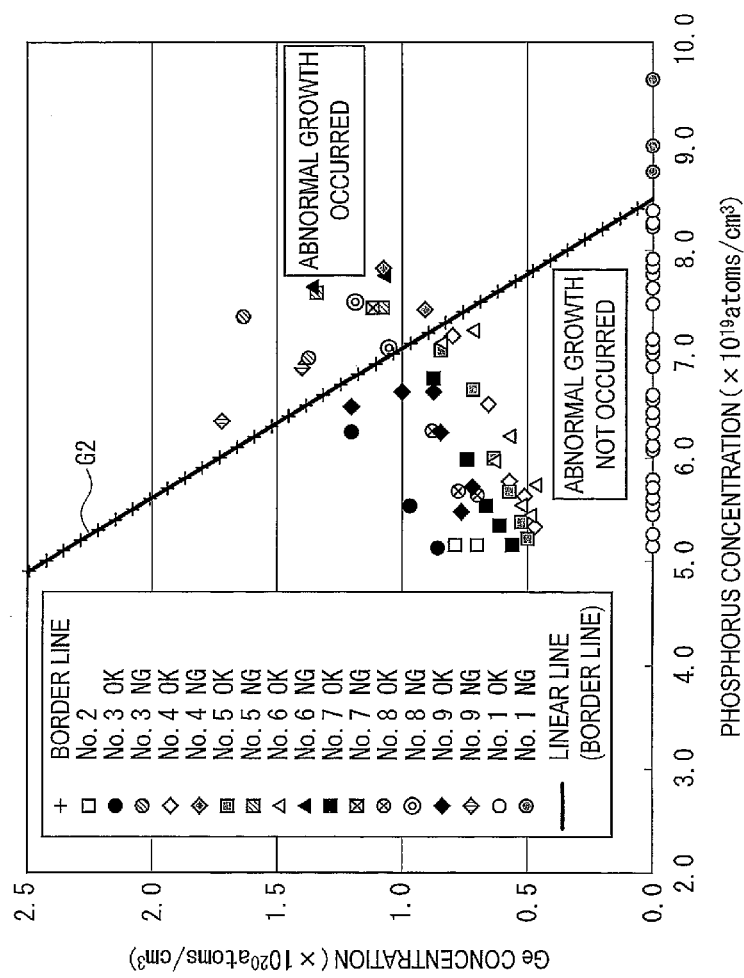
FIG. 5 is a graph showing a relationship between a phosphorus concentration and germanium concentration in the growing crystal in the above exemplary embodiment.

Accordingly, phosphorus concentration and germanium concentration in the grown crystal according to the samples of Nos. 1 to 9 were compared in a scatter diagram. Then, a critical line G2 that divided an abnormal-growth occurring area and a non-occurring area was found as shown in FIG. 5. The critical line G2 is given by the following formula (18).

$$[Ge] = -6.95 \times [P] + 5.90 \times 10^{20} \quad (18)$$

Since no abnormal growth occurred on the left side of the critical line G2 given by the formula (18), the condition for avoiding the abnormal growth is given by the following formula (19).

$$[Ge] < -6.95 \times [P] + 5.90 \times 10^{20} \quad (19)$$

Further, in order to conduct a pull-up operation so that the phosphorus concentration [P] and germanium concentration [Ge] in the growing crystal satisfy the formula (19), the doping amount of the respective components and the pull-up condition have to be controlled. Since germanium is not evaporated during the pull-up operation and thus accords with theoretical equilibrium segregation, the germanium concentration incorporated into a crystal is determined by an initial input. The concentration of phosphorus can also be controlled by an initial input. However, the amount of phosphorus incorporated into crystal does not accord with theoretical equilibrium segregation but decreases on account of evaporation during the pull-up operation. Thus, the phosphorus concentration [P] can be controlled by controlling the evaporation.

Where, for instance, an evaporated amount of phosphorus from the silicon melt doped with germanium is J; phosphorus concentration contained in the silicon melt is N; flow volume of inert gas introduced into a chamber during the pull-up operation is A; a pressure in the chamber during the pull-up operation is Y; and coefficients are α and β, the phosphorus concentration can be controlled by controlling at least one of the flow volume A and the pressure Y so that the evaporated amount J becomes a predetermined value at a predetermined timing during the pull-up operation based on the following formula (20), thereby satisfying the above formula (19).

$$J = \alpha\sqrt{X} \cdot \exp(\beta N/\sqrt{Y}) \quad (20)$$

2. On Lattice Distortion

Figure 6:
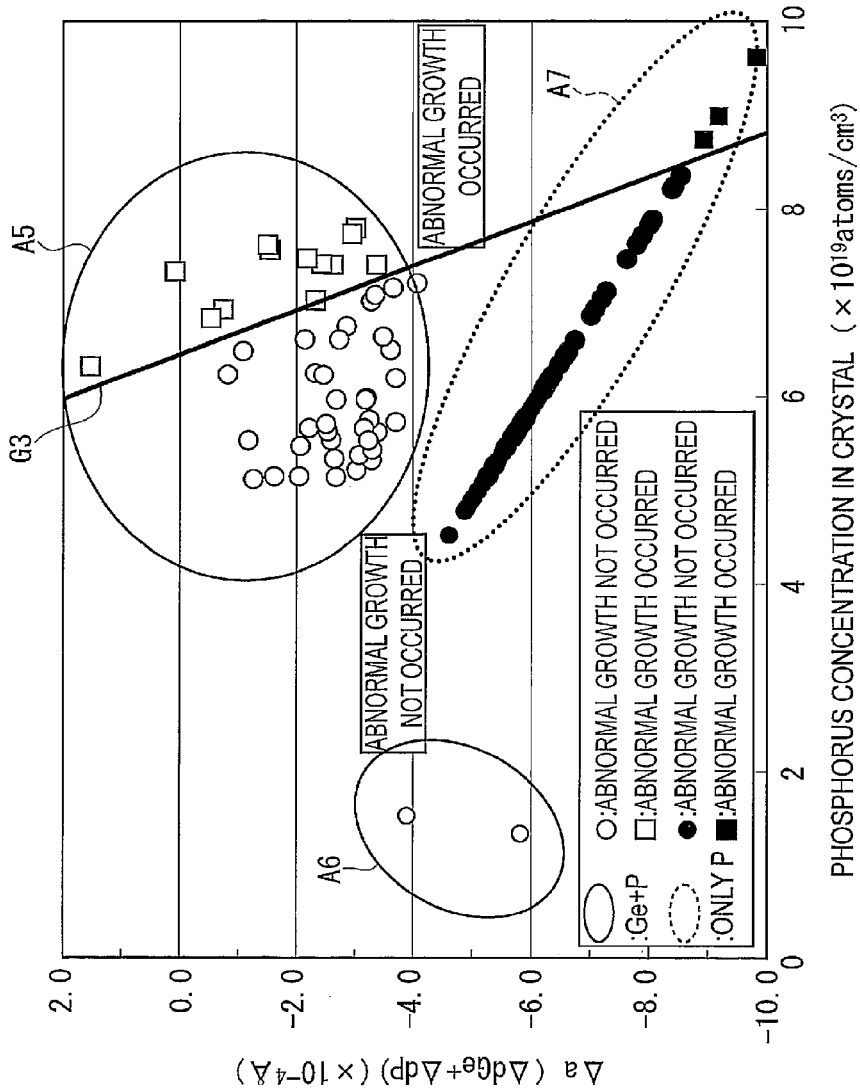
FIG. 6 is a graph showing a relationship between a phosphorus concentration in the growing crystal and difference in lattice constant in the above exemplary embodiment.

The scatter diagram shown in FIG. 5 can also be represented based on Vegard's Law as a scatter diagram of phosphorus concentration [P](atoms/cm$^3$) in the growing crystal and difference in lattice constant $\Delta a(\Delta d_{Ge}+\Delta d_P)$(Å) representing a lattice distortion of silicon, which specifically is given as a scatter diagram shown in FIG. 6.

In FIG. 6, the plots in areas A5 and A6 represent samples in which phosphorus and germanium were co-doped and the plots in an area A7 represent samples in which only phosphorus was doped.

Circular plots represent that no abnormal growth occurred and rectangular plots represent that an abnormal growth occurred.

A critical line G3 that divides the area in accordance with the occurrence of the abnormal growth can be drawn in the area A5 showing the results of co-doping of phosphorus and germanium and the area A7 showing the results of doping of only phosphorus. It is recognized that no abnormal growth occurred on the left side of the critical line G3.

The critical line G3 is obtained based on experimental data, which is calculated according to a difference in crystal lattice constant $\Delta a(\text{Å})=\Delta d_{Ge}+\Delta d_P$ ($\Delta d_{Ge}$: strain of Si by Ge (Å), $\Delta d_P$: strain of Si by P (Å)). By growing a crystal so that the following formula (21) is satisfied, lattice distortion can be controlled while avoiding the abnormal growth by Vegard's Law. Incidentally, $d_{Si}$(Å) represents a lattice constant of silicon, $r_{Si}$(Å) represents a covalent radius of silicon, $r_P$(Å) represents a covalent radius of phosphorus and $r_{Ge}$(Å) represents a covalent radius of Ge.

$$\Delta a = \Delta d_{Ge} + \Delta d_P = \left(\left(\frac{r_{Ge}-r_{Si}}{r_{Si}}\right) \times \frac{[Ge]}{[Si]} + \left(\frac{r_P-r_{Si}}{r_{Si}}\right) \times \frac{[P]}{[Si]}\right) \times d_{Si} < \quad (21)$$
$$-4.24736 \times 10^{-23} \times [P] + 2.78516 \times 10^{-3}$$

The sample co-doping phosphorus and germanium exhibited a difference in crystal lattice constant Δa closer to zero as compared to the sample in which only phosphorus was doped, which shows that the lattice distortion caused on account of phosphorus is mitigated by co-doping germanium.

Next, some of the grown crystals obtained according to pull-up conditions of Nos. 1 to 9 shown in Table 1 were sampled to compare occurrences of misfit dislocation in providing an epitaxial layer on semiconductor wafers cut from the grown crystal in which only phosphorus was doped and on semiconductor wafers cut from the grown crystal in which phosphorus and germanium were co-doped.

The misfit dislocation was determined by photographing the surface of the semiconductor provided with the epitaxial layer by an X-ray diffraction measurement.

The results showing the occurrences of the misfit dislocations in the grown crystal in which only phosphorus was doped are shown in Table 3. The results of the grown crystal in which phosphorus and germanium were co-doped are shown in Table 4. Incidentally, "A" represents that "no misfit dislocation occurred" and "B" represents that "misfit dislocation occurred".

TABLE 3

| | Resistivity (mΩ · cm) | | | | | | | | | |
|---|---|---|---|---|---|---|---|---|---|---|
| Epi Thickness (μm) | 1 | 1.1 | 1.2 | 1.3 | 1.5 | 1.6 | 1.9 | 2.5 | 3.1 | 3.4 |
| After Epi 15 | B | B | B | B | B | B | B | A | A | A |
| 10 | B | B | B | B | A | B | A | A | A | A |
| 6 | A | A | A | A | A | A | A | A | A | A |
| Thermal 15 | B | B | B | B | B | B | B | B | B | B |
| treatment 10 | B | B | B | B | B | B | B | B | A | A |
| after Epi 6 | B | B | B | B | B | B | A | A | A | A |
| Difference in Lattice constant (×10$^{-4}$ Å) | −7.75 | −7.06 | −6.24 | −5.61 | −4.91 | −4.54 | −3.72 | −2.84 | −2.21 | −1.95 |
| Note | | | | | P: 500 g | | | | | |

TABLE 4

| | Resistivity (mΩ · cm) | | | | |
|---|---|---|---|---|---|
| Epi Thickness (μm) | 1.01 | 1.16 | 1.36 | 1.16 | 1.39 |
| After Epi 15 | A | A | A | A | A |
| 10 | A | A | A | A | A |
| 6 | A | A | A | — | — |
| Thermal 15 | B | B | B | A | A |
| treatment 10 | B | B | A | A | A |
| after Epi 6 | A | A | A | A | A |
| Difference in Lattice constant (×10$^{-4}$ Å) | −3.11 | −3.71 | −3.25 | −1.76 | −1.95 |
| Note | P: 500 g Ge: 750 g | | | P: 500 g Ge: 500 g | |

According to Table 3, when only phosphorus was doped, occurrence of misfit dislocation varied between a target resistivity 1.6 mΩ·cm and 1.9 mΩ·cm. Thus, it can be recognized that misfit dislocation becomes difficult to occur where the difference in lattice constant Δa relative to silicon is approximately −4.0×10$^{-4}$ Å.

Next, comparison between Tables 3 and 4 shows that, when only phosphorus was doped, while the semiconductor wafer of target resistivity 1 mΩ·cm exhibited a difference in lattice constant of −7.75×10$^{-4}$ Å, the semiconductor wafer of target resistivity 1.01 mΩ·cm in which phosphorus and germanium were co-doped exhibited a difference in lattice constant of −3.11×10$^{-4}$ Å. Accordingly, it is recognized that co-doping phosphorus and germanium greatly lessen the lattice distortion.

In view of the above, when phosphorus and germanium are to be co-doped, it is preferable that germanium doping amount relative to phosphorus in the growing crystal is adjusted so that the difference in lattice constant relative to silicon becomes $-4.0\times10^{-4}$ Å or less.

Specifically, phosphorus concentration [P](atoms/cm$^3$) is fixed based on Vegard's Law shown in the following formula (22) and germanium concentration [Ge](atoms/cm$^3$) at which absolute value of the difference in lattice constant at the fixed phosphorus concentration is smaller than $\pm 4.0\times10^{-4}$ Å is calculated. Incidentally, $d_{Si}$ represents a lattice constant (Å) of silicon.

$$\Delta d_{Ge} + \Delta d_P = \qquad (22)$$
$$\pm 4.0\times 10^{-4} = \left(\left(\frac{r_{Ge}-r_{Si}}{r_{Si}}\right)\times\frac{[Ge]}{[Si]} + \left(\frac{r_P-r_{Si}}{r_{Si}}\right)\times\frac{[P]}{[Si]}\right)\times d_{Si}$$

In sum, in order to restrain the misfit dislocation, it is preferable that germanium concentration [Ge](atoms/cm3) relative to phosphorus concentration [P](atoms/cm3) in a growing crystal is set within a range specified by the following formula (23).

$$2.2\times[P]-8.62\times10^{19} < [Ge] < 2.2\times[P]+8.62\times10^{19} \qquad (23)$$

Based on the concentration range of germanium deduced by the formula (23) and the formula (19) defined in the above-mentioned "1. On Abnormal Growth", the germanium concentration range that restrains the misfit dislocation while avoiding abnormal growth in a certain phosphorus concentration is the region surrounded by the abnormal-growth critical line G2, and the misfit-restraining critical lines G4 and G5 according to the formula (23).

Figure 7:
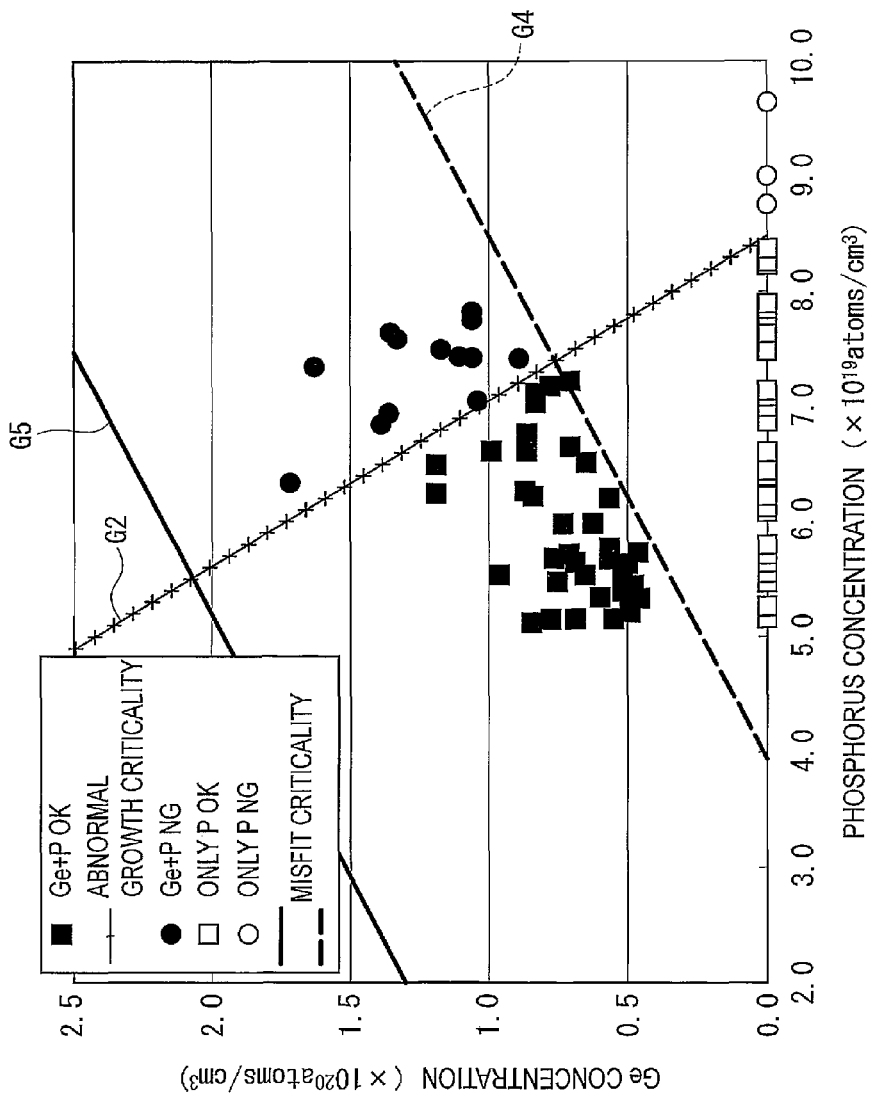
FIG. 7 is a graph showing a relationship between a phosphorus concentration and germanium concentration in the growing crystal in the above exemplary embodiment.

Further, a high-concentration N-type semiconductor substrate typically refers to a substrate having $4.84\times10^{19}$ atoms/cm$^3$ or more of phosphorus concentration. As shown in FIG. 7, since X intercept of the critical line G2 is $8.49\times10^{19}$ atoms/cm$^3$, the concentration of phosphorus is preferably set in a range represented by the following (24).

$$4.84\times10^{19} \le [P] \le 8.49\times10^{19} \qquad (24)$$

3. Influence of Co-Doping of Phosphorus and Germanium

The above-described identification of the critical line G2 based on the abnormal growth and identification of the critical lines G4 and G5 in view of the lattice distortion generally apply to co-doping of phosphorus and germanium, where germanium may be doped in the silicon melt in advance and phosphorus may be subsequently doped as dopant gas.

In addition to the above, simultaneous doping of phosphorus and germanium leads to the following unique advantages.

Specifically, in order to confirm the effect of the simultaneous doping of phosphorus and germanium, comparison was made between a sample obtained by initially doping germanium and subsequently pulling up while supplying phosphorus and another sample obtained by simultaneous doping. As a result, it was confirmed that final monocrystallization rate was 88.0% in the germanium-initial doping, whereas the final monocrystallization rate was 92.6% in the simultaneous doping, which proved, though slightly, that the monocrystallization rate was enhanced in the simultaneous doping.

Figure 8:
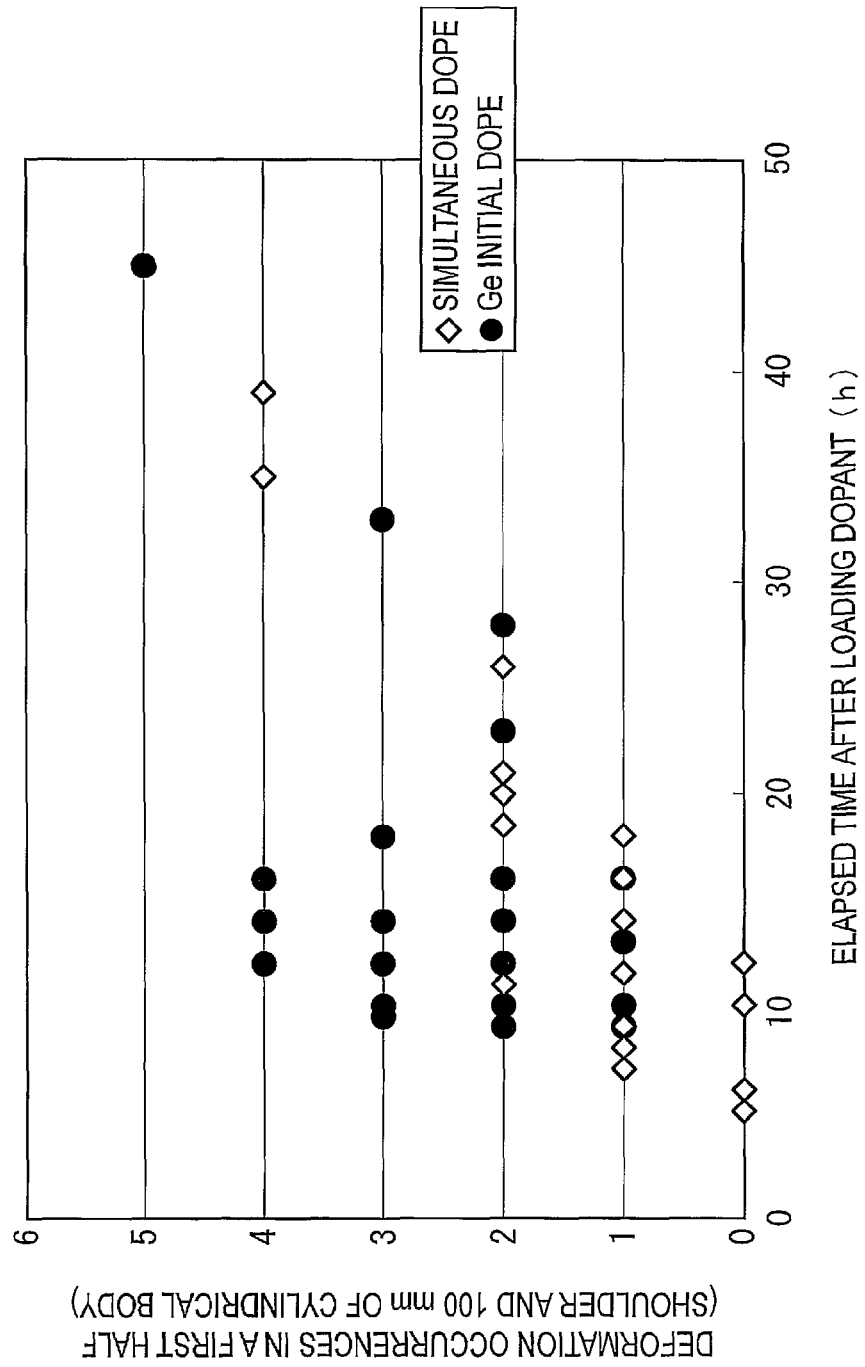
FIG. 8 is a graph showing a relationship between an elapsed time after loading a dopant and a deformation frequency of a pulled-up crystal.

Next, shoulder and sub-shoulder deformation of an ingot pulled-up after the germanium-initial doping and the simultaneous doping was examined. Then, as shown in FIG. 8, germanium-initial doping exhibited V-shaped increase in the number of shoulder-deformation after approximately 10 to 15 hours after loading the dopant. On the other hand, the simultaneous doping exhibited gradual increase in the number of deformation in accordance with the elapsed time after loading the dopant, where it was confirmed that the deformation did not occur at particular periods as in the germanium-initial doping.

This is presumably because of the following reasons. When germanium is initially doped, since the melting point of germanium is lower than silicon, germanium is initially melted and silicon is melted thereafter, so that gas component is mingled when silicon melt and solid is mixed with germanium melt to generate bubbles. Since germanium has a large surface tension, once the bubbles are generated, the bubbles remains for a long time. Accordingly, even when germanium is totally dissolved into the silicon melt, germanium adheres in growing a crystal, which inhibits monocrystallization.

On the other hand, since small portions of germanium are gradually mixed into a large amount of silicon melt in the simultaneous doping, bubbles are unlikely to be generated.

The increase in the number of deformation in accordance with elapsed time occurs presumably because of degradation of the quartz crucible of the pull-up device caused on account of long-time use, which is considered to influence also on the final monocrystallization rate.

Since the crystal has to be pulled up after a long time in the germanium-initial doping because of the presence of the particular periods at which the shoulder deformation is frequent. On the other hand, no such particular periods are found in the simultaneous doping, so that the simultaneous doping greatly contributes to improvement in productivity.

When a plurality of crystals are pulled up in the germanium-initial doping, germanium concentration is decreased after pulling up the first crystal because of equilibrium segregation phenomenon. Accordingly, the dopant has to be supplemented. However, only phosphorus can be doped in the germanium-initial doping, where originally desired properties for preventing misfit dislocations cannot be given to the crystals.

On the other hand, since phosphorus and germanium are simultaneously doped in the simultaneous doping, silicon monocrystal with desired properties can be grown.

Further, after comparing the germanium concentration in a crystal relative to germanium input, i.e. germanium absorption rate, in the germanium-initial doping and that in the simultaneous doping, it was found that germanium absorption rate was only around 90% in the germanium-initial doping, whereas the germanium absorption rate amounted to as high rate as 98% in the simultaneous doping.

Though not accurately known in detail, this is presumably because specific gravity of germanium is greater than silicon, so that germanium is unequally resided in the lower part of the silicon melt in the quartz crucible to cause the results.

The invention claimed is:

1. A producing method of a silicon monocrystal, comprising:
   adding phosphorus (P) and germanium (Ge) into a silicon melt or adding phosphorus into a silicon/germanium melt; and
   growing a silicon monocrystal from the silicon melt by a Czochralski method;
   wherein:
   a phosphorus concentration $[P]_L$(atoms/cm$^3$) in the silicon melt, a Ge concentration [Ge](atoms/cm$^3$) in the silicon monocrystal, an average temperature gradient $G_{ave}$ (K/mm) and a pull speed V (mm/min) are controlled to satisfy a formula (1) as follows; and a phosphorus concentration [P](atoms/cm³) and the Ge concentration [Ge](atoms/cm3) in the silicon monocrystal satisfy a relationship according to a formula (2) as follows while growing the silicon monocrystal, where $d_{Si}$(Å) represents a lattice constant of silicon, $r_{Si}$(Å) represents a covalent radius of silicon, $r_P$(Å) represents a covalent radius of phosphorus, and $r_{Ge}$(Å) represents a covalent radius of Ge:

$$[P]_L + (0.3151 \times [Ge] + 3.806 \times 10^{18})/1.5 < 0.5 \times (G_{ave}/V + 43) \times 10^{19} \quad (1)$$

$$\left(\left(\frac{r_{Ge} - r_{Si}}{r_{Si}}\right) \times \frac{[Ge]}{[Si]} + \left(\frac{r_p - r_{Si}}{r_{Si}}\right) \times \frac{[P]}{[Si]}\right) \times d_{Si} < \quad (2)$$
$$-4.24736 \times 10^{-23} \times [P] + 2.78516 \times 10^{-3}.$$

2. The producing method according to claim 1, wherein the phosphorus concentration [P](atoms/cm³) and the Ge concentration [Ge](atoms/cm³) satisfy a relationship according to a formula (3) as follows while growing the silicon monocrystal:

$$2.2 \times [P] - 8.62 \times 10^{19} < [Ge] < 2.2 \times [P] + 8.62 \times 10^{19} \quad (3).$$

* * * * *